(12) United States Patent
Yang

(10) Patent No.: US 9,640,548 B2
(45) Date of Patent: May 2, 2017

(54) METHOD FOR FABRICATING NON-VOLATILE MEMORY DEVICE

(75) Inventor: Ki-Hong Yang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 823 days.

(21) Appl. No.: 13/607,350

(22) Filed: Sep. 7, 2012

(65) Prior Publication Data

US 2013/0237025 A1 Sep. 12, 2013

(30) Foreign Application Priority Data

Mar. 8, 2012 (KR) ........................ 10-2012-0024072

(51) Int. Cl.
*H01L 21/8238* (2006.01)
*H01L 27/11582* (2017.01)
*H01L 21/336* (2006.01)

(52) U.S. Cl.
CPC .............................. *H01L 27/11582* (2013.01)

(58) Field of Classification Search
CPC combination set(s) only.
See application file for complete search history.

(56) References Cited

U.S. PATENT DOCUMENTS

2011/0059595 A1* 3/2011 Jung .............................. 438/430
2011/0147824 A1* 6/2011 Son et al. ...................... 257/324
2011/0291177 A1* 12/2011 Lee et al. ...................... 257/324

FOREIGN PATENT DOCUMENTS

KR 1020050091262 3/2005
KR 1020110035547 4/2011

OTHER PUBLICATIONS

Ryota Katsumata, et al., "Pipe-shaped BiCS Flash Memory with 16 Stacked Layers and Multi-Level-Cell Operation for Ultra High Density Storage Device,".
2009 Symposium on VLSI Technology Digest of Technical Papers, pp. 136-137.

* cited by examiner

*Primary Examiner* — Calvin Choi
(74) *Attorney, Agent, or Firm* — IP & T Group LLP

(57) ABSTRACT

A method for fabricating a non-volatile memory device includes forming a stacked structure where a plurality of inter-layer dielectric layers and a plurality of second sacrificial layers are alternately stacked over the first gate electrode layer, forming a first channel hole that exposes the first sacrificial layer by penetrating through the stacked structure, forming a second channel hole by removing the exposed first sacrificial layer, forming an oxide layer by oxidizing a surface of the first gate electrode layer exposed through the first and second channel holes, forming a channel layer in the first and second channel holes, and forming second gate electrode layers in spaces from which the second sacrificial layers are removed, wherein a memory layer is interposed between the channel layer and the second gate electrode layer.

15 Claims, 7 Drawing Sheets

METHOD FOR FABRICATING NON-VOLATILE MEMORY DEVICE

CROSS-REFERENCE TO RELATED APPLICATIONS

The present application claims priority of Korean Patent Application No. 10-2012-0024072, filed on Mar. 8, 2012, which is incorporated herein by reference in its entirety.

BACKGROUND

1. Field

Exemplary embodiments of the present invention relate to a method for fabricating a non-volatile memory device, and more particularly, to a method for fabricating a non-volatile memory device including a plurality of memory cells that are stacked in multiple layers on a substrate.

2. Description of the Related Art

A non-volatile memory device retains data although power is turned off. Diverse non-volatile memory devices, such as a NAND-type flash memory device, are widely used.

As a two-dimensional non-volatile memory device where memory cells are formed in a single layer has reached technical limitation in increasing its integration degree, a three-dimensional non-volatile memory device where a plurality of memory cells are stacked in multiple layers on a silicon substrate is suggested.

Three-dimensional non-volatile memory devices of diverse structures are being developed, and among them is a flash memory that is referred to as a PBiCS. A PBiCS flash memory device is well known and disclosed in an article entitled "Pipe-Shaped BiCS Flash Memory with 16 Stacked Layers And Multi-Level-Cell Operation for Ultra-High Density Storage Devices," VLSI Technology, Jun. 16-18, 2009 symposium, ISBN 978-4-86348-009-4, pp. 136-137. The PBiCS flash memory device is fabricated through a series of processes of forming a pipe gate electrode layer having a sacrificial layer, forming a stacked structure where a plurality of inter-layer dielectric layers and a plurality of cell gate electrode layers are alternately stacked over the pipe gate electrode layer, removing the sacrificial layer exposed after memory holes penetrating through the stacked structure are formed, depositing a memory layer having a triple-layer structure of oxide-nitride-oxide (ONO) in the memory holes and a space from which the sacrificial layer is removed, and depositing silicon bodies that are used as channels over the memory layer.

When the PBiCS flash memory device is fabricated through the above-described fabrication process, it may have the following features.

When the ONO layer is deposited in the memory holes and the space from which the sacrificial layer is removed, the ONO layer is deposited thinner in the space from which the sacrificial layer is removed than in the memory holes due to step coverage characteristics. When the ONO layer is thin in the space from which the sacrificial layer is removed, breakdown voltage may be so low that it is difficult to apply a high voltage, such as a pass voltage, to the pipe gate electrode layer. This is because the reliability of the PBiCS flash memory device is deteriorated, for example, threshold voltage thereof is increased, when a high voltage is applied to the pipe gate electrode layer.

When the thickness of the ONO layer is increased in overall, the memory holes having a narrow width are filled with the ONO layer and thus the space where the channels are to be formed may not be secured.

SUMMARY

An exemplary embodiment of the present invention is directed to a method for fabricating a non-volatile memory device with device reliability by improving a fabrication process.

In accordance with an exemplary embodiment of the present invention, a method for fabricating a non-volatile memory device includes forming a first gate electrode layer having a first sacrificial layer over a substrate, forming a stacked structure where a plurality of inter-layer dielectric layers and a plurality of second sacrificial layers are alternately stacked over the first gate electrode layer having the first sacrificial layer, forming a first channel hole that exposes the first sacrificial layer by penetrating through the stacked structure, forming a second channel hole by removing the exposed first sacrificial layer, forming an oxide layer by oxidizing a surface of the first gate electrode layer exposed through the first and second channel holes, forming a channel layer in the first and second channel holes, removing the second sacrificial layers, and forming second gate electrode layers in spaces from which the second sacrificial layers are removed, wherein a memory layer is interposed between the channel layer and the second gate electrode layer.

In accordance with another exemplary embodiment of the present invention, a method for fabricating a non-volatile memory device includes forming a first gate electrode layer having a first sacrificial layer over a substrate, forming a stacked structure where a plurality of inter-layer dielectric layers and a plurality of second gate electrode layers are alternately stacked over the first gate electrode layer having the first sacrificial layer, forming a first channel hole that exposes the first sacrificial layer by penetrating through the stacked structure, forming a second channel hole by removing the exposed first sacrificial layer; forming a first oxide layer by oxidizing a surface of the first gate electrode layer exposed through the first and second channel holes, and sequentially forming a charge storing layer, a tunnel insulation layer, and a channel layer in the first and second channel holes.

DETAILED DESCRIPTION

Figure 1:
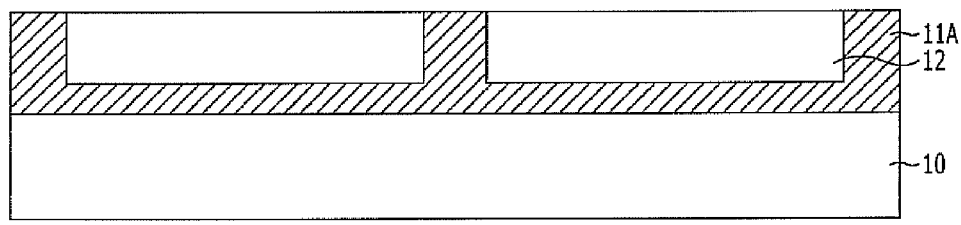
FIGS. 1 to 7 are cross-sectional views illustrating a method for fabricating a non-volatile memory device in accordance with an exemplary embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIGS. 1 to 7 are cross-sectional views illustrating a method for fabricating a non-volatile memory device in accordance with an embodiment of the present invention.

Referring to FIG. 1, a substrate 10 is provided. The substrate 10 may be formed of a semiconductor material such as monocrystalline silicon, and an insulation layer, which is not shown in the drawing, may be formed over the uppermost portion of the substrate 10 to insulate a gate electrode of a pipe channel transistor, which is to be described later, and the substrate 10 from each other. The gate electrode of a pipe channel transistor is referred to as a pipe gate electrode, hereinafter.

Subsequently, a first conductive layer 11A for forming a pipe gate electrode is formed over the substrate 10, and then a first sacrificial layer 12 is formed by selectively etching the first conductive layer and filling the etched first conductive layer 11A with an insulation material. The first conductive layer 11A may be formed of a conductive material that may be oxidized during a subsequent oxidation process. For example, the first conductive layer 11A may be formed of polysilicon doped with an impurity. The first sacrificial layer 12 defines a space where the channels of a pipe channel transistor are to be formed. The first sacrificial layer 12 has a shape of islands each having a long axis in the cross-sectional direction shown in the drawing, which is referred to as a first direction, and a short axis in a direction penetrating through the drawing, which is referred to as a second direction. The second direction is perpendicular to the first direction.

A plurality of island-type pieces of the first sacrificial layer 12 are arrayed in the first direction and the second direction. For the description purposes, the embodiment of the present invention describes a case where two island-type pieces of the first sacrificial layer 12 are arrayed in the first direction, but the scope and concept of the present invention are not limited to it. A plurality of island-type pieces of the first sacrificial layer 12 may be arrayed in the first direction and the second direction. The first sacrificial layer 12 may be a nitride layer.

Figure 2:
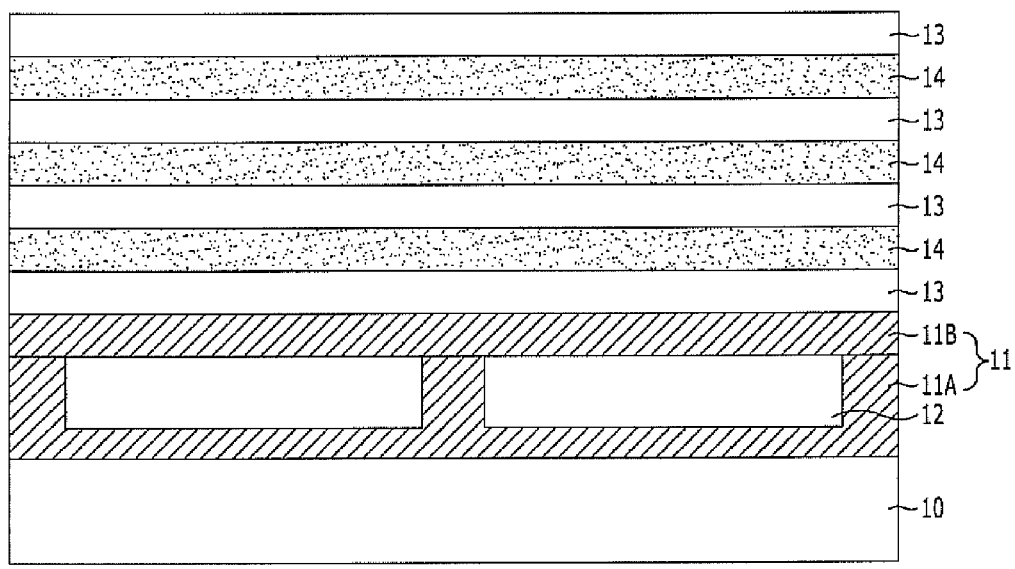

Referring to FIG. 2, a second conductive layer 11B for forming a pipe gate electrode is formed over the first conductive layer 11A and the first sacrificial layer 12. The second conductive layer 11B may be formed of a conductive material that may be oxidized in a subsequent oxidation process. For example, the second conductive layer 11B may be formed of polysilicon doped with an impurity. Hereinafter, the first conductive layer 11A and the second conductive layer 11B are collectively referred to as a pipe gate electrode layer 11. The process of forming the second conductive layer 11B may be omitted, and in this case, the first conductive layer 11A forms the pipe gate electrode.

Subsequently, a plurality of inter-layer dielectric layers 13 and a plurality of second sacrificial layers 14 are alternately stacked over the second conductive layer 11B. When the formation of the second conductive layer 11B is omitted, the inter-layer dielectric layers 13 and the second sacrificial layers 14 are alternately stacked over the first conductive layer 11A and the first sacrificial layer 12. The second sacrificial layers 14 provide the space where the gate electrodes of memory cells are to be formed. The gate electrodes of memory cells are referred to as cell gate electrodes. The second sacrificial layers 14 may be formed of a material having an etch selectivity from the inter-layer dielectric layers 13. For example, the second sacrificial layers 14 may be oxide layers.

Figure 3:
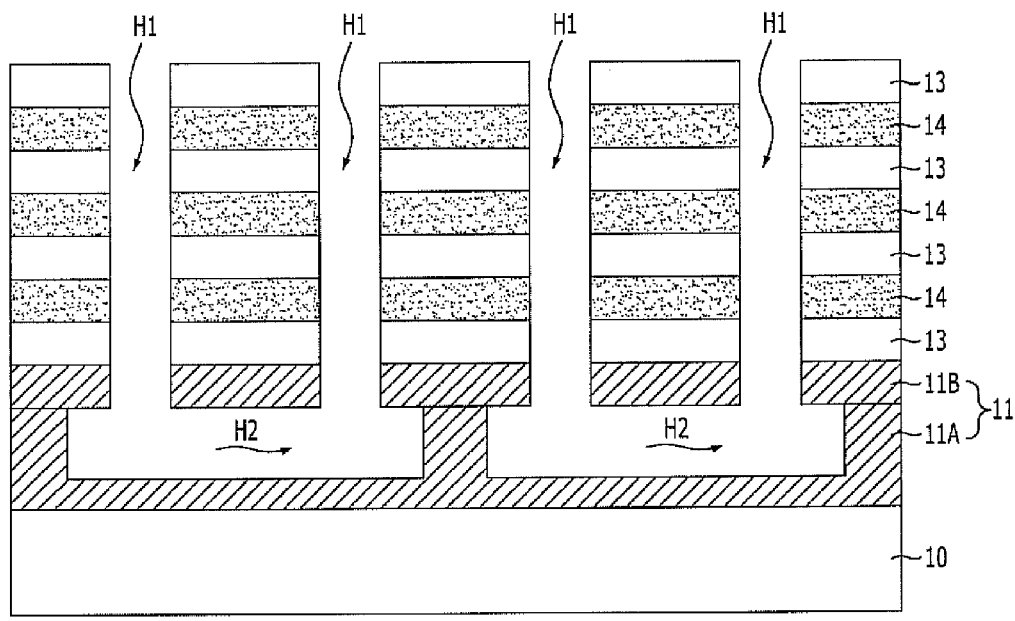

Referring to FIG. 3, first channel holes H1 are formed to expose the first sacrificial layer 12 while penetrating through the second conductive layer 11B and the stacked structure of the inter-layer dielectric layers 13 and the second sacrificial layers 14. The first channel holes H1 are disposed in such a manner that the first channel holes H1 of a pair are arrayed in the first direction for each island-type piece of first sacrificial layer 12.

Subsequently, second channel holes H2 are formed by removing the exposed first sacrificial layer 12 through such a method as a wet etch process. When the first sacrificial layer 12 and the second sacrificial layers 14 are formed of the same layer, for example, nitride layers, a protective layer (not shown) may be formed of amorphous carbon on the sidewalls of the first channel holes H1 before the first sacrificial layer 12 is removed.

As a result, the lower ends of the first channel holes H1 of a pair are physically connected with each other through each second channel hole H2 so as to substantially form a U-shaped channel hole.

Figure 4:
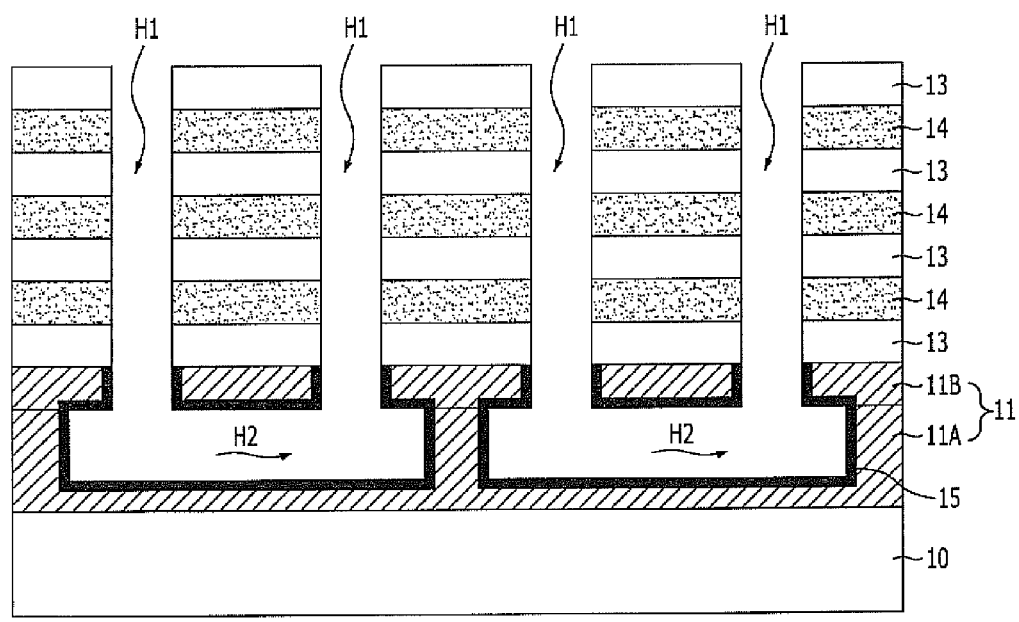

Referring to FIG. 4, an oxidation process is performed on the substrate structure obtained from the process of FIG. 3. The oxidation process may be a thermal oxidation process.

As a result of the oxidation process, the surface of the pipe gate electrode layer 11 that is exposed through the first channel holes H1 and the second channel holes H2 is oxidized to form an oxide layer 15. The oxide layer 15 serves as a gate insulation layer of a pipe channel transistor. Through the oxidation process, the inter-layer dielectric layers 13 and the second sacrificial layers 14 that are exposed through the first channel holes H1 are not oxidized and maintain their previous state because they are of an insulation material.

Since the oxide layer 15 may be formed on the surface of the pipe gate electrode layer 11 through the oxidation process, a thick oxide layer 15 may be formed. In other words, the thickness of the gate insulation layer of the pipe channel transistor may be increased. Therefore, although a high voltage is applied to the pipe gate electrode layer 11, threshold voltage variation is reduced and thus reliability of the non-volatile memory device may be improved.

Figure 5:
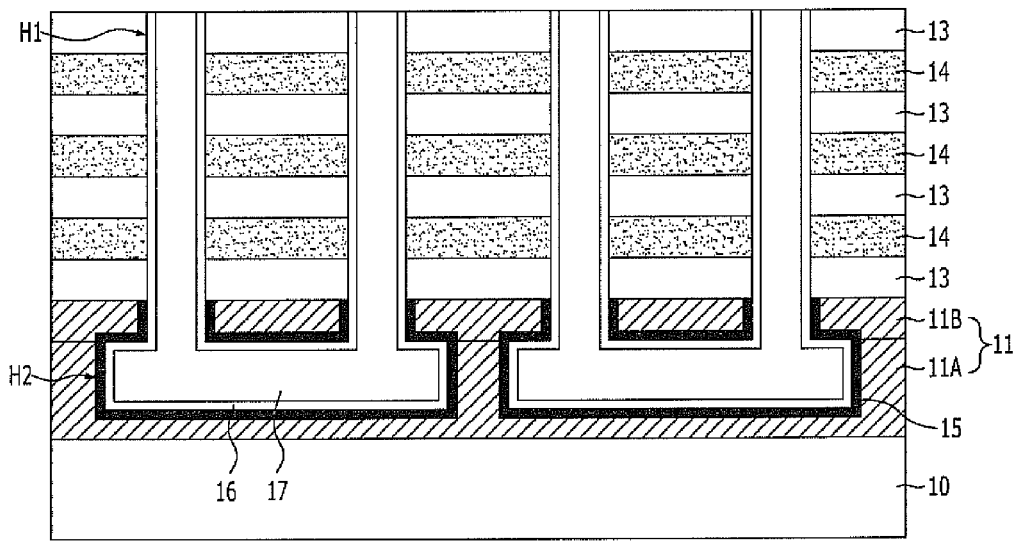

Referring to FIG. 5, after a first insulation layer 16 is formed on the internal walls of the first channel holes H1 and the second channel holes H2 where the oxide layer 15 is formed, a channel layer 17 filling the first channel holes H1 and the second channel holes H2 is formed.

In this embodiment of the present invention, the first insulation layer 16 may be a memory layer having a triple-layer structure of oxide-nitride-oxide (ONO), which includes a charge blocking layer, a charge storing/trapping layer, and a tunnel insulation layer. If the first insulation layer 16 is an ONO layer, a portion of the first insulation layer 16 contacting on the pipe gate electrode layer 11 may serve as a gate insulation layer of a pipe channel transistor along with the oxide layer 15. In this way, a thicker gate insulation layer may be formed. Also, a portion of the first insulation layer 16 contacting on the second sacrificial layers 14 may function as a memory layer.

The channel layer 17 may be formed of a semiconductor material doped with an impurity or an undoped semiconductor material. In this embodiment, the channel layer 17 has a thickness that fills the first channel holes H1 and the second channel holes H2, but the scope and concept of the present invention are not limited to it and the channel layer 17 may be formed thin to fill a portion of each of the first channel holes H1 and the second channel holes H2 according to another embodiment of the present invention.

As a result, a pipe channel transistor includes the pipe gate electrode layer 11, the channel layer 17, and a gate insulation layer (refer to reference numerals '15' and '16') interposed between the pipe gate electrode layer 11 and the channel layer 17. Since the pipe channel transistor in this embodiment of the present invention further includes the second conductive layer 11B that covers the first sacrificial layer 12, the contact area between the channel layer 17 and the pipe gate electrode layer 11 of the pipe channel transistor is increased, raising on-current.

Figure 6:
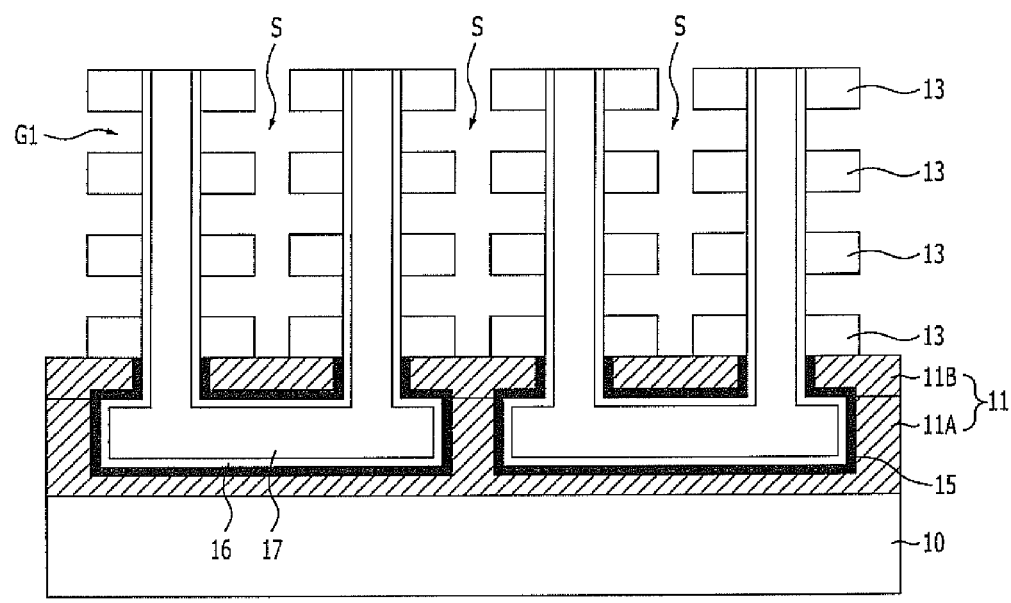

Referring to FIG. 6, slits S are formed between the first channel holes H1 to penetrate through the stacked structure of the inter-layer dielectric layers 13 and the second sacrificial layers 14.

The slits S provide space into which a wet etch solution permeates in order to remove the second sacrificial layers 14. In this embodiment of the present invention, the slits S has a depth of penetrating through the stacked structure, but the scope and concept of the present invention are not limited to it, and the slits S may have a depth of penetrating through the stacked structure to the lowermost second sacrificial layer 14. Furthermore, a slit S between a pair of the first channel holes H1 separates cell gate electrodes in one first channel hole H1 from those in the other first channel hole H1 within one string. The slit S may have a shape of stretching in the second direction between pairs of the first channel holes H1.

Subsequently, grooves G1 are formed by removing the second sacrificial layers 14 that are exposed through the slits S through a wet etch process.

Figure 7:
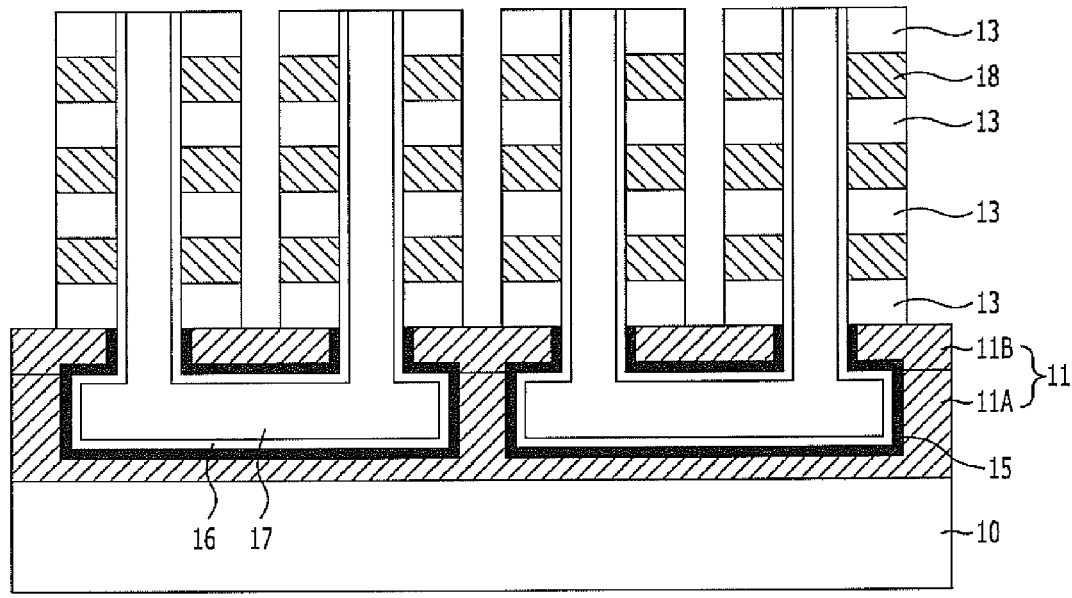

Referring to FIG. 7, a cell gate electrode layer 18 is formed by filling the grooves G1 with a conductive material. The cell gate electrode layer 18 may be formed by forming a conductive layer to cover the substrate structure including the grooves G1 and performing a blanket etch process. The cell gate electrode layer 18 may be formed of polysilicon doped with an impurity or metal.

As a result of the process, memory cells include the cell gate electrode layer 18, the channel layer 17, and the first insulation layer 16, which serves as a memory layer between the cell gate electrode layer 18 and the channel layer 17.

Since the subsequent processes, such as a process of forming bit lines coupled with the upper end of one side of the channel layer 17 and a process of forming source lines coupled with the upper end of the other side of the channel layer 17, are widely known to those skilled in the art to which the present invention pertains, detailed description is omitted.

Meanwhile, in the embodiment of the present invention, the first insulation layer 16 may be a general insulation layer that does not function as a memory layer. In this case, the fabrication process may be modified, and this is described below with reference to FIGS. 8 and 9.

Figure 8:
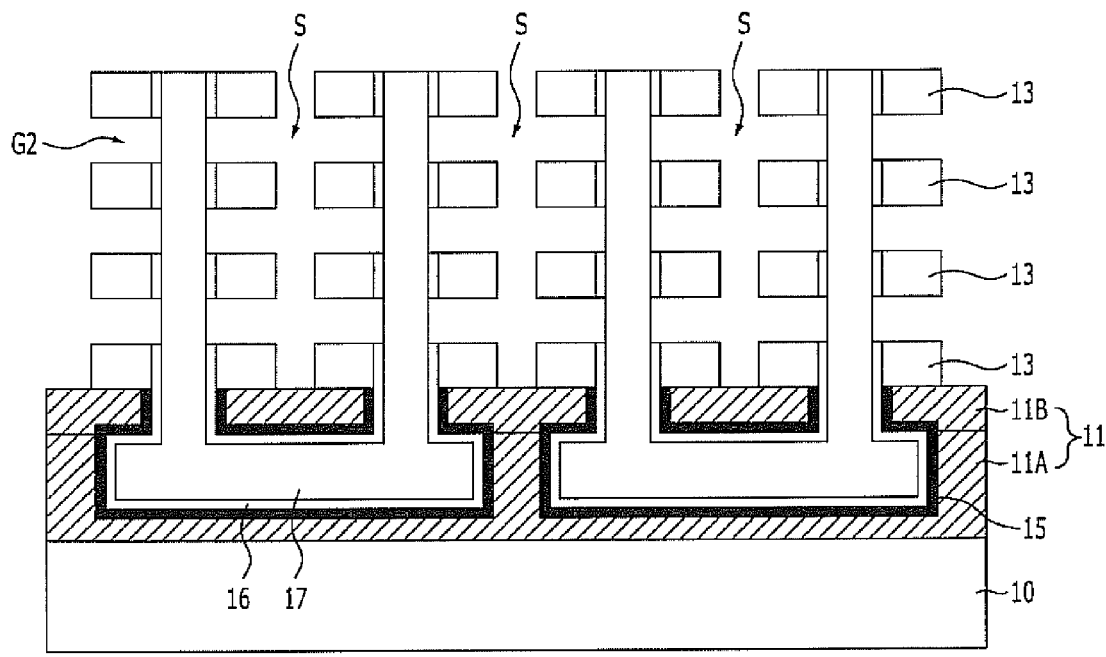
FIGS. 8 and 9 are cross-sectional views illustrating a method for fabricating a non-volatile memory device in accordance with another exemplary embodiment of the present invention.
Figure 9:
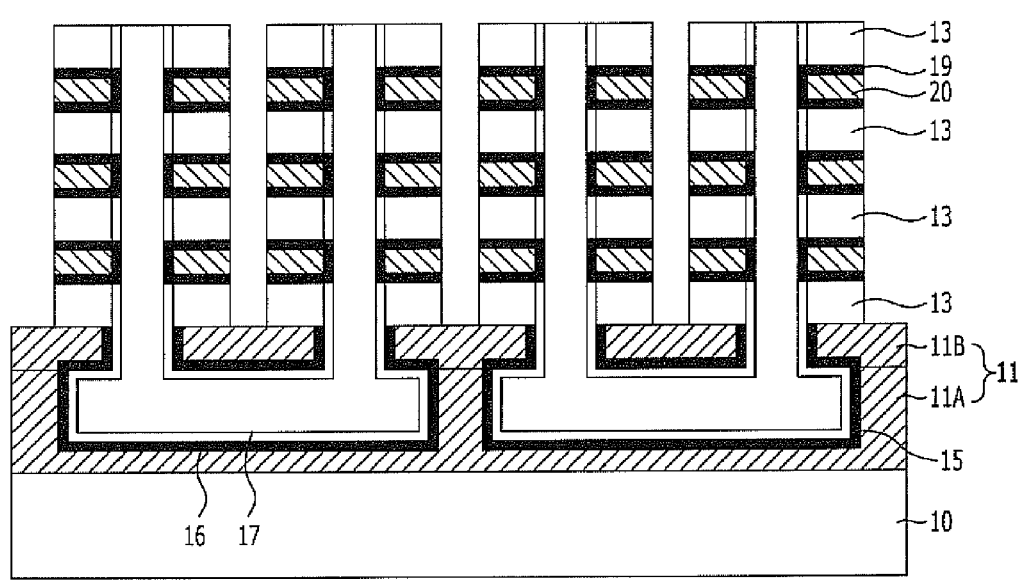

FIGS. 8 and 9 are cross-sectional views illustrating a method for fabricating a non-volatile memory device in accordance with another embodiment of the present invention. The description of this embodiment is made focusing on the difference from that of the previously described embodiment.

First, the processes of FIGS. 1 to 5 are performed. In this embodiment, the first insulation layer 16 may be an insulation layer that does not function as a memory layer. For example, the first insulation layer 16 may be an oxide layer. A portion of the first insulation layer 16 contacting on the pipe gate electrode layer 11 may function as a gate insulation layer of a pipe channel transistor along with the oxide layer 15. In this case, a thicker gate insulation layer may be obtained. Also, a portion of the first insulation layer 16 contacting on the second sacrificial layers 14 may function as a protective layer for protecting the channel layer 17 in a subsequent process of removing the second sacrificial layers 14.

Subsequently, referring to FIG. 8, slits S are formed between the first channel holes H1 to penetrate through the stacked structure of the inter-layer dielectric layers 13 and the second sacrificial layers 14, and then grooves G2 exposing the channel layer 17 are formed by removing the first insulation layer 16 that is exposed after removing the second sacrificial layers 14 exposed through the slits S. However, the scope and concept of the present invention are not limited to it, and the first insulation layer 16 may not be removed in the process of forming the grooves G2.

Referring to FIG. 9, a memory layer 19 including a charge blocking layer, a charge storing layer, and a tunnel insulation layer is formed on the internal walls of the grooves G2, and then a cell gate electrode layer 20 is formed by filling the grooves G2 with a conductive material. If the first insulation layer 16 is not removed in the process of forming the grooves G2, the process of forming the tunnel insulation layer of the memory layer 19 may be omitted. This is because the first insulation layer 16 may function as a tunnel insulation layer.

Furthermore, although not illustrated in the drawing, the whole process of forming the first insulation layer 16 may be omitted. In this case, the channel layer 17 is exposed through the grooves G2, and a cell gate electrode layer may be formed by forming a memory layer on the internal walls of the grooves G2 and filling the remaining space with a conductive material.

Meanwhile, although the above-described embodiments of the present invention illustrate the method of forming a cell gate electrode layer in the space from which the sacrificial layer is removed, a cell gate electrode layer may be directly deposited instead of the sacrificial layer. This case is described in detail below with reference to FIGS. 10 to 13.

FIGS. 10 to 13 are cross-sectional views illustrating a method for fabricating a non-volatile memory device in accordance with yet another embodiment of the present invention. This embodiment is described focusing on the difference from the above-described embodiment.

Figure 10:
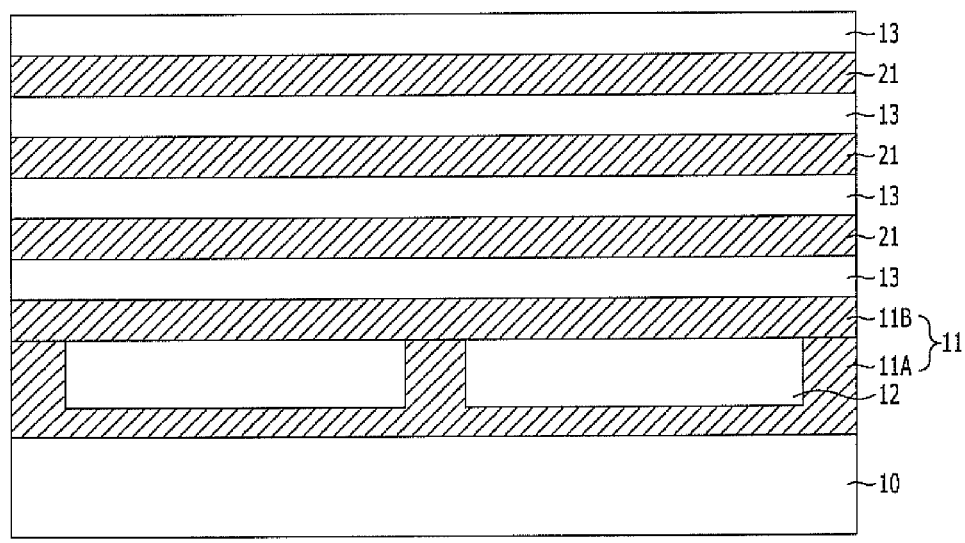
FIGS. 10 to 13 are cross-sectional views illustrating a method for fabricating a non-volatile memory device in accordance with yet another exemplary embodiment of the present invention.

Referring to FIG. 10, a first conductive layer 11A having a first sacrificial layer 12 is formed over a substrate 10, and then a second conductive layer 11B is formed over the first conductive layer 11A. The first conductive layer 11A and the second conductive layer 11B form a pipe gate electrode layer 11, and the first conductive layer 11A and the second conductive layer 11B are formed of a conductive material that may be oxidized.

Subsequently, a plurality of inter-layer dielectric layers 13 and a plurality of cell gate electrode layers 21 are alternately stacked over the second conductive layer 11B. The cell gate electrode layers 21 may be formed of a conductive material that may be easily etched, such as polysilicon doped with an impurity. Furthermore, the cell gate electrode layers 21 may be formed of a conductive material that is less oxidized than the pipe gate electrode layer 11. For example, when the pipe gate electrode layer 11 is formed of a semiconductor material doped with an N-type impurity, the cell gate electrode layers 21 may be formed of a semiconductor material doped with a P-type impurity, Referring to FIG. 11, first channel holes H1 are formed to expose the first sacrificial layer 12 by penetrating through the second conductive layer 11B and the stacked structure of the inter-layer dielectric layers 13 and the cell gate electrode layers 21, where the first channel holes H1 are paired up. Subsequently, second channel holes H2 are formed by removing the exposed first sacrificial layer 12.

Figure 11:
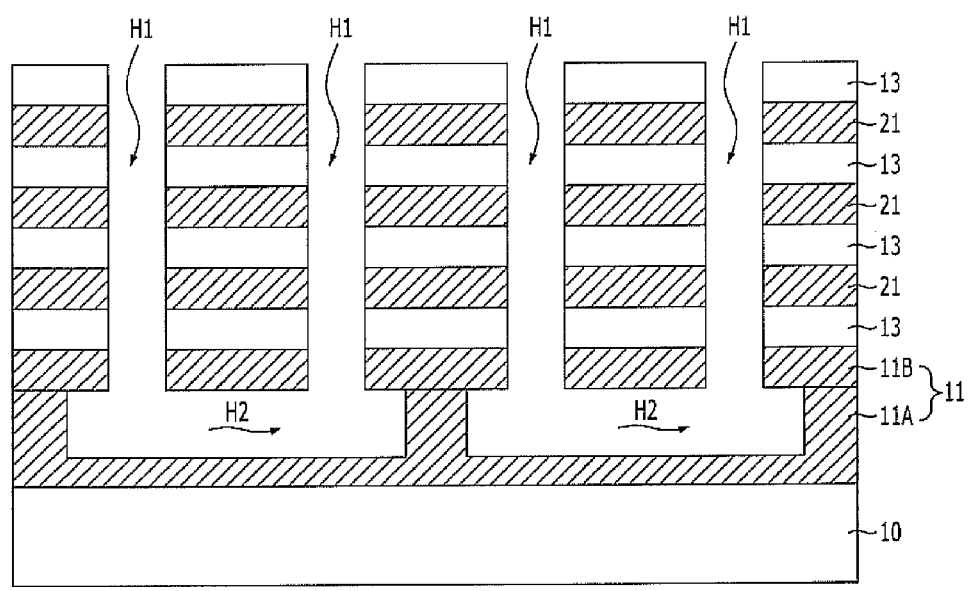
Figure 12:
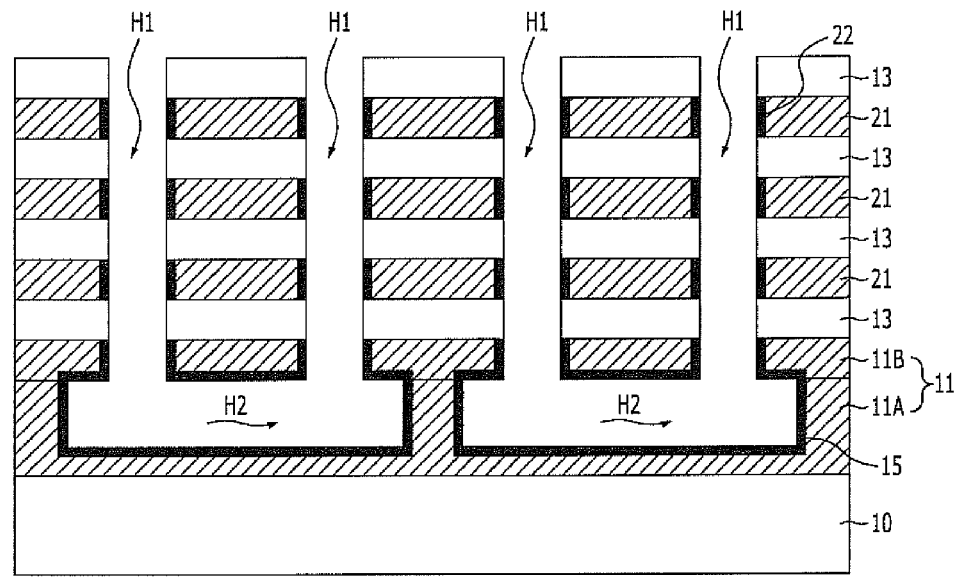

Referring to FIG. 12, an oxidation process is performed onto the substrate structure of FIG. 11. The oxidation process may be a thermal oxidation process.

As a result of the oxidation process, the surface of the pipe gate electrode layer 11 that is exposed through the first channel holes H1 and the second channel holes H2 is oxidized so as to form a first oxide layer 15. Furthermore, the surfaces of the cell gate electrode layers 21 exposed through the first channel holes H1 are oxidized so as to form second oxide layers 22. The second oxide layers 22 may function as a charge blocking layer of a memory layer.

If the cell gate electrode layers 21 are formed of a conductive material that is less oxidized than the pipe gate electrode layer 11, the second oxide layers 22 may be thinner than the first oxide layer 15. Therefore, the first channel holes H1 may secure a space where a subsequent channel layer is to be formed.

Figure 13:
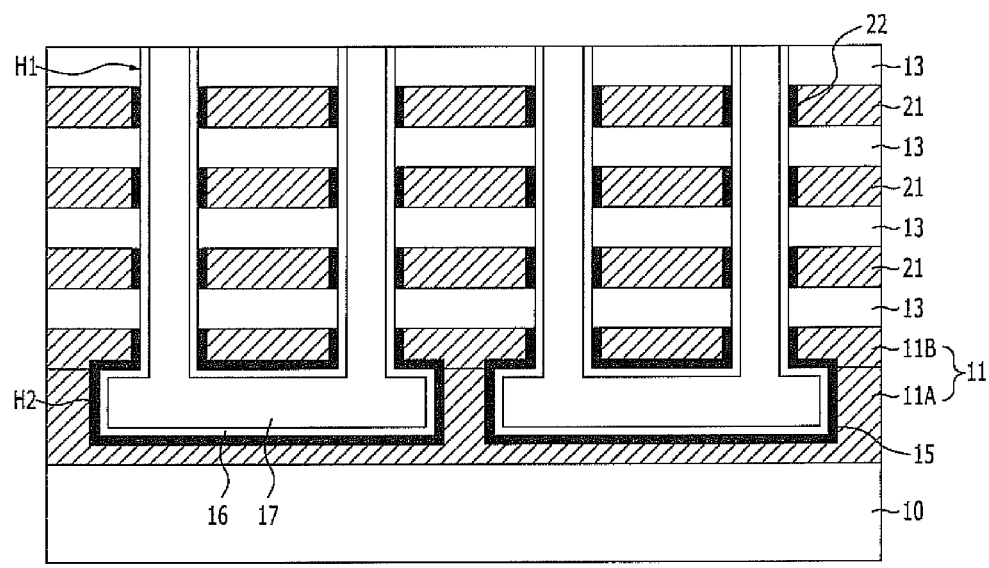

Referring to FIG. 13, a first insulation layer 16 is formed on the internal walls of the first channel holes H1 and the second channel holes H2 where the first oxide layer 15 and the second oxide layers 22 are formed, and then a channel layer 17 filling the first channel holes H1 and the second channel holes H2 is formed.

In this embodiment of the present invention, the first insulation layer 16 may be a memory layer having a triple-layer structure of oxide-nitride-oxide (ONO), which includes a charge blocking layer, a charge storing layer, and a tunnel insulation layer. Also, the first insulation layer 16 may be a nitride-oxide (NO) layer without a charge blocking layer. Although the charge blocking layer is omitted, the second oxide layers 22 may function as a charge blocking layer between the cell gate electrode layers 21 and the channel layer 17. In this case, a portion of the first insulation layer 16 contacting on the pipe gate electrode layer 11 may serve as a gate insulation layer of a pipe channel transistor along with the first oxide layer 15. In this way, a thick gate insulation layer may be obtained. Also, a portion of the first insulation layer 16 contacting on the cell gate electrode layers 21 may function as a memory layer along with the second oxide layers 22.

Subsequently, although not illustrated in the drawing, subsequent processes known to those skilled in the art, such as a process of forming slits S for separating the cell gate electrode layers 21 by penetrating through the stacked structure between the first channel holes H1 of a pair, a process of forming bit lines coupled with the upper end of one side of the channel layer 17, and a process of forming source lines coupled with the upper end of the other side of the channel layer 17, are performed.

The method for fabricating a non-volatile memory device in accordance with an embodiment of the present invention may secure device reliability with improved procedures.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a non-volatile memory device, comprising:
    forming a first gate electrode layer and a first sacrificial layer over a substrate;
    forming a stacked structure where a plurality of inter-layer dielectric layers and a plurality of second sacrificial layers are alternately stacked over the first gate electrode layer and the first sacrificial layer;
    forming a pair of first channel holes that expose the first sacrificial layer by penetrating through the stacked structure;
    forming a second channel hole by removing the exposed first sacrificial layer so that the pair of first channel holes and the second channel hole are connected to each other to form a U-shape hole;
    forming an oxide layer by oxidizing a surface of the first gate electrode layer exposed through the first and second channel holes;
    forming a channel layer in the first and second channel holes;
    removing the second sacrificial layers; and
    forming second gate electrode layers in spaces from which the second sacrificial layers are removed, wherein a memory layer is interposed between the channel layer and the second gate electrode layer,
    wherein the inter-layer dielectric layers and the second sacrificial layers are formed of materials which are not oxidized during the forming of the oxide layer so that the oxide layer is formed only on the surface of the first gate electrode layer exposed through the first and second channel holes.

2. The method of claim 1, wherein the first gate electrode layer surrounds an entire surface of the first sacrificial layer.

3. The method of claim 2, wherein the pair of first channel holes are formed by etching the stacked structure and the first gate electrode layer on the first sacrificial layer.

4. The method of claim 1, wherein the removing of the second sacrificial layers includes:
    forming a slit having a depth to expose the second sacrificial layers in the stacked structure; and
    removing the second sacrificial layers exposed through the slit.

5. The method of claim 1, further comprising:
    forming the memory layer on the internal walls of the first and second channel holes, before the forming of the channel layer.

6. The method of claim 1, further comprising:
    forming the memory layer on the internal walls of the spaces from which the second sacrificial layers are removed, after the removing of the second sacrificial layers.

7. The method of claim 6, further comprising:
    forming an insulation layer on the internal walls of the first and second channel holes, before the forming of the channel layer.

8. The method of claim 7, further comprising:
    removing the insulation layer exposed through the spaces from which the second sacrificial layers are removed, before the forming of the memory layer.

9. The method of claim 1, further comprising:
   forming a tunnel insulation layer of the memory layer on the internal walls of the first and second channel holes, before the forming of the channel layer, and
   forming a charge storing layer and a charge blocking layer of the memory layer on the internal walls of the spaces from which the second sacrificial layers are removed, after the removing of the second sacrificial layers.

10. The method of claim 1, further comprising:
    forming a protective layer on the sidewalls of the pair of first channel holes, before the forming of the second channel hole.

11. A method for fabricating a non-volatile memory device, comprising:
    forming a first gate electrode layer and a first sacrificial layer over a substrate;
    forming a stacked structure where a plurality of interlayer dielectric layers and a plurality of second gate electrode layers are alternately stacked over the first gate electrode layer and the first sacrificial layer;
    forming a pair of first channel holes that expose the first sacrificial layer by penetrating through the stacked structure;
    forming a second channel hole by removing the exposed first sacrificial layer so that the pair of first channel holes and the second channel hole are connected to each other to form a U-shape hole;
    forming a first oxide layer by oxidizing a surface of the first gate electrode layer exposed through the first and second channel holes and forming a second oxide layer by oxidizing a surface of the second gate electrode layer exposed through the first channel hole; and
    sequentially forming a charge storing layer, a tunnel insulation layer, and a channel layer in the first and second channel holes,
    wherein the second gate electrode layer is formed of a conductive material that is less oxidized than the first gate electrode layer so that the second oxide layer is thinner than the first oxide layer.

12. The method of claim 11, wherein the first gate electrode layer surrounds an entire surface of the first sacrificial layer.

13. The method of claim 12, wherein the pair of first channel holes are formed by etching the stacked structure and the first gate electrode layer on the first sacrificial layer.

14. The method of claim 11, wherein the second gate electrode layer is formed of a semiconductor material doped with a P-type impurity, and the first gate electrode layer is formed of a semiconductor material doped with an N-type impurity.

15. The method of claim 11, further comprising:
    forming a charge blocking layer in the first and second channel holes, after the forming of the first oxide layer.

* * * * *